United States Patent [19]
Ehman et al.

[11] Patent Number: 6,021,050
[45] Date of Patent: Feb. 1, 2000

[54] PRINTED CIRCUIT BOARDS WITH INTEGRATED PASSIVE COMPONENTS AND METHOD FOR MAKING SAME

[75] Inventors: Michael F. Ehman, North Ogden; Larry L. Eslinger, South Ogden, both of Utah

[73] Assignee: Bourns, Inc., Riverside, Calif.

[21] Appl. No.: 09/204,130

[22] Filed: Dec. 2, 1998

[51] Int. Cl.[7] ............................................. H05K 1/16
[52] U.S. Cl. ........................... 361/793; 361/763; 361/766; 361/782; 174/255; 174/257; 174/258; 428/209; 428/210; 428/901; 29/846
[58] Field of Search .................................. 361/763, 766, 361/780, 782, 792–795, 270, 311, 312–314, 321.2, 321.3, 321.4; 174/255–259; 29/620, 829, 830, 846; 428/209, 210, 901; 427/96, 98; 333/12, 185, 246, 247; 338/310, 314

[56] References Cited

U.S. PATENT DOCUMENTS

| | | | |
|---|---|---|---|
| 3,913,219 | 10/1975 | Lichtblau ................................. | 29/592.1 |
| 3,947,956 | 4/1976 | Leroux et al. ........................... | 29/847 |
| 4,416,914 | 11/1983 | Eichelberger et al. .................. | 427/510 |
| 4,555,745 | 11/1985 | Westermeir et al. .................... | 361/320 |
| 4,566,186 | 1/1986 | Bauer et al. ............................. | 29/852 |
| 4,632,845 | 12/1986 | Obstfelder et al. ...................... | 427/96 |
| 4,774,634 | 9/1988 | Tate et al. ................................. | 361/760 |
| 4,808,434 | 2/1989 | Bennett et al. ........................... | 427/510 |
| 4,870,746 | 10/1989 | Klaser ....................................... | 29/620 |
| 5,225,969 | 7/1993 | Takaya et al. ............................ | 361/795 |
| 5,298,687 | 3/1994 | Rapoport et al. ........................ | 174/261 |
| 5,305,523 | 4/1994 | Bross et al. ............................... | 29/832 |
| 5,347,258 | 9/1994 | Howard et al. .......................... | 338/333 |
| 5,354,599 | 10/1994 | McClanahan et al. .................. | 428/209 |
| 5,384,434 | 1/1995 | Mandai et al. .......................... | 174/258 |
| 5,428,190 | 6/1995 | Stopperan ................................ | 174/261 |
| 5,502,889 | 4/1996 | Casson et al. ............................ | 29/830 |
| 5,527,998 | 6/1996 | Anderson et al. ........................ | 174/255 |
| 5,599,595 | 2/1997 | McGinley et al. ....................... | 428/33 |
| 5,688,584 | 11/1997 | Casson et al. ............................ | 428/209 |
| 5,716,663 | 2/1998 | Capote et al. ............................ | 427/96 |
| 5,727,310 | 3/1998 | Casson et al. ............................ | 29/830 |
| 5,747,222 | 5/1998 | Ryu .......................................... | 430/312 |
| 5,758,575 | 6/1998 | Isen et al. ................................. | 101/153 |
| 5,763,058 | 6/1998 | Isen et al. ................................. | 428/209 |
| 5,814,366 | 9/1998 | Fukuta et al. ............................ | 427/96 |

OTHER PUBLICATIONS

Electronic Materials and Processes Handbook, 2nd ed., McGraw–Hill, Inc., Harper & Sampson, eds., "Printed–Wiring Boards" by V.J. Brzozowski and C.T. Brooks, pp. 2.5–2.6 and 2.12–2.13, 1994.

*Primary Examiner*—Gerald Tolin
*Assistant Examiner*—John B. Vigushin
*Attorney, Agent, or Firm*—Christie, Parker & Hale, LLP

[57] ABSTRACT

A multi-layered printed circuit board having a plurality of burried passive elements and a method for producing the circuit board wherein the passive elements can include resistors, capacitors and inductors. The method includes the steps of manufacturing individual layers of the multi-layer printed circuit board with electrical circuits thereon and subsequently screening polymer inks having resistive, dielectric or magnetic values to form the resistors, capacitors and inductors. Each layer of the circuit board is cured to dry the polymer ink and thereafter the individual layers are bonded together to form the multi-layer board.

14 Claims, 2 Drawing Sheets

PRINTED CIRCUIT BOARDS WITH INTEGRATED PASSIVE COMPONENTS AND METHOD FOR MAKING SAME

FIELD OF THE INVENTION

This invention relates to printed circuit boards, and more particularly to multi-layer printed circuit boards having integrated passive resistors, capacitors and inductors.

BACKGROUND OF THE INVENTION

The electronics industry is driven by the continual requirements to reduce space and reduce cost. A significant amount of the space and the cost of a populated printed circuit board is in the passive components such as resistors, capacitors and inductors. When systems designers shrink a board, the logical path would be to bury these passive components into the circuit board itself. Companies and laboratories throughout the world have tried to accomplish this but have failed due to either high temperature processing requirements of the materials used to fabricate the components, coefficient of thermal expansion mismatch, or flexure of the board which fractures or distorts the materials used to fabricate the components.

Frequently, electronic circuits contained on printed circuit boards require a very large number of passive components to perform various functions, such as terminating circuits, current limiters or digital attenuators. One method used to increase the density of conductor paths on printed circuit boards has been through the use of multi-layer boards in which multiple layers, each containing etched copper circuitry, are sandwiched together. In addition to the method in which individual printed circuit layers are separately fabricated using, for example, a photolithographic process, and then laminated together, there have been uses of thin, screened-on insulating layers between multiple conductor planes to increase the density of conductors on a circuit board. In the past, multi-layer printed circuit boards having screened-on resistors have been produced. Such circuit boards however did not accommodate other passive components within multiple individual layers of the printed circuit board. Consequently a need exists for a multi-layer printed circuit board and method for manufacturing the multi-layer printed circuit board which accommodates multiple passive components such as resistors, capacitors and inductors within the individual layers of the printed circuit board.

SUMMARY OF THE INVENTION

The present invention provides a multi-layer printed circuit board and a method for manufacturing the printed circuit board using conventional multi-layer core materials and having resistor, capacitor, and inductor elements on one or more intermediate layers of the printed circuit board. The method for producing the multi-layer printed circuit board utilizes a material system where the resistors, and portions of the capacitors and inductors are fabricated from polymer thick film inks that are screen printed onto the printed circuit board and then fired at temperatures compatible with the common printed circuit board materials, such as glass or epoxy (FR4, FR5, etc.).

The method for producing the multi-layer printed circuit board of the present invention can accommodate multiple passive elements that vary in value from other elements contained on the same layer, and the value of the elements contained on each individual layer may be adjusted after screen printing. The screening process to apply one or more of the passive elements on to one or more layers of the printed circuit board is completed prior to bonding the layers together to form the multi-layer board. The passive components can also be produced at least in part from a polymer thick film (PTF) resistive paste which may be screened onto the surface of a printed circuit. PTF paste having different resistivities may be blended with each other prior to screening onto the circuit board to achieve specific sheet resistivities. A pattern of circuit paths for electrically connecting the passive components is formed on the surface of one or more layers of the multi-layer printed circuit board using any conventional technique well known in the art. For example, the circuit paths may be prepared from a copper clad substrate using a photolithographic process in which the desired conductor paths are photolithographically reproduced on the printed circuit board from a photo mask. Areas are provided between adjacent conductors which are to be connected by the screened components. Each layer of the multi-layer board is baked in an oven after completion of the screening process to completely dry and fire the PTF material. The individual layers of the multi-layer board may thereafter be bonded to each other in any conventional, known manner, for example by the use of B-stage thermal setting resin for bondings FR4 epoxy multi-layer boards.

BRIEF DESCRIPTION OF THE DRAWINGS

The features and advantages of the present invention will be more readily understood from an examination of the detailed description of a preferred embodiment in conjunction with the accompanying drawings wherein.

DETAILED DESCRIPTION

Figure 1:
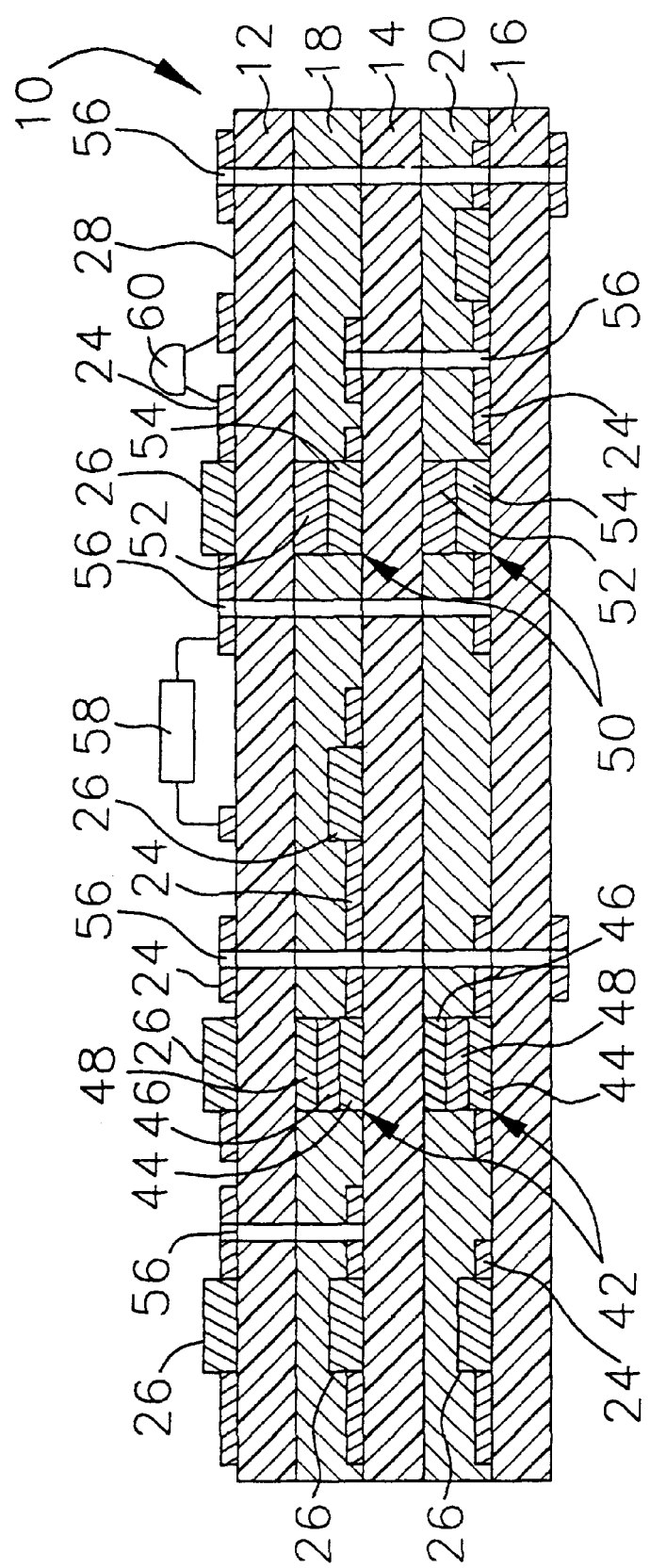
FIG. 1 is a cross-sectional side view of a multi-layer printed circuit board having passive integrated components on intermediate layers manufactured according to the method of this invention.

Referring to the drawings, FIG. 1 shows a three-layer printed circuit board 10 of the present invention. Printed circuit board 10 consists of three layers 12, 14 and 16. Layers 12–16 may be manufactured from any material used for multi-layer printed circuit boards, for example an epoxy resin impregnated glass fiber matrix commonly referred to as FR4 or a polyamide resin material. Other materials such as glass in the case of rigid boards or polymeric tape such as CAPTON tape for flexible printed circuit boards can be utilized. Combinations of rigid, flexible and rigid/flexible printed circuit boards are also contemplated by the present invention. Layers 12–16 are bonded to each other by intermediate layers 18 and 20 in any well known manner, for example by use of a B-stage thermal setting resin. Although printed circuit board 10 is illustrated with respect to three layers, the multi-layer printed circuit board of the present invention contemplates any number of layers.

Figure 2:
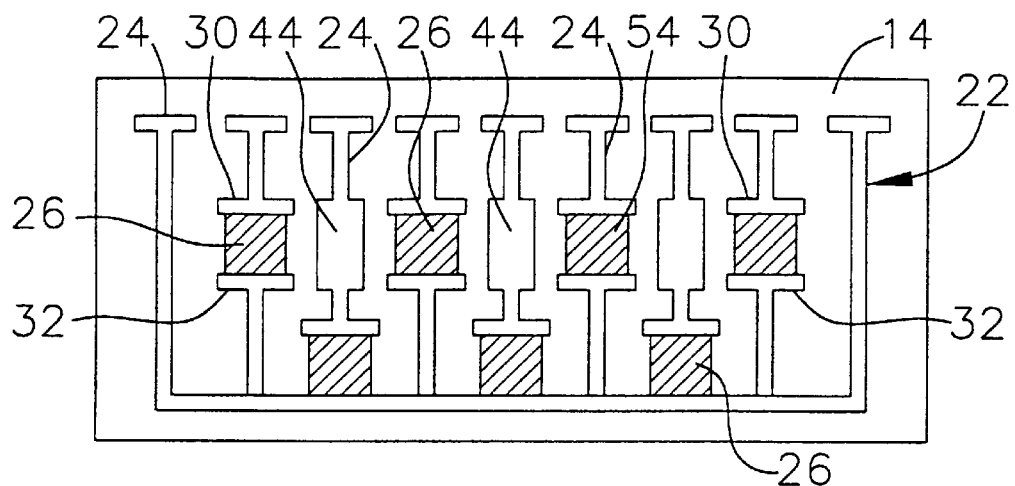
FIG. 2 is a top plan view of one layer of the multi-layer printed circuit board of FIG. 1.

As shown in FIG. 2 each layer, for example layer 14, may contain one or more electrical circuits 22 having a pattern of electrical conductors 24 formed on one side of the layer using any suitable method known in the art. The metal conductor lines of circuit 22 are first formed on the printed circuit board material leaving spaces where a passive element such as a resistor 26 would be placed. The formation of these lines follows standard printed circuit board fabrication techniques, well known in the art, such as for example using a photolithographic process in which undesired portions of a layer of copper bonded to the layer 14 are selectively etched away in an acid etch bath after the copper layer has been coated with a photo resist such as Dynachem brand photo laminar, exposed to a source of ultraviolet light through a photo mask containing the desired pattern of electrical conductors, and then developed using, for example, a potassium carbonate solution. Typically, an electrical circuit is positioned on both the upper and lower surfaces of each layer of the PCB.

A pattern of one or more of the resistors 26 may be screened onto one or more layers of the multi-layer printed circuit board as shown in FIG. 2. After producing the electrical circuit 22 on layer 14, the board is chemically cleaned in preparation for the screening of the resistors 26 thereon. A preferred method of cleaning involves spraying a mild acid micro etch, for example sodium persulphate, onto the surface of the board and then passing the board through a stream of warm forced air to dry the board. The resistors 26 placed on each layer are manufactured from a polymer resistor ink such as a resistive paste having a known sheet resistivity. Any commercially resistive paste or polymer resistor ink can be used. Polymer resistor ink or resistive paste will be referred to as polymer thick film or PTF. The PTF may be applied to the layer using a screening process using, for example, a PRESCO Model CP-8115 screen printer to apply the PTF. The PTF is forced through a 200 mesh stainless steel screen having a pattern embossed thereon corresponding to the pattern of resistors to be screened on the layer. The PTF is applied such that it overlaps the associated portion of the electrical circuit 22. The layer with the PTF is then heated to approximately 230° C. for such time as the PTF is cured. The time and temperature of the curing cycle will vary slightly depending upon the type and thickness of the ink.

The PTF materials is available in different resistivities which can be blended to yield resistors having specific resistance values. If the tolerance of the resister needs to be adjusted, then laser trimming, a procedure well known in the art is performed. This process of screening the resistors to the individual layers of the printed circuit board is repeated for each layer that requires a resistor with the exception of the top level of the printed circuit board 10. Should the printed circuit board only require resistors the individual layers 12–16 are then treated with standard bonding agents 18 and 20, assembled in a stack, and bonded using standard techniques known in the industry, such as in an autoclave. If the top side 28 of the printed circuit board 10 also requires resistors, then the top side resistors are screen printed and cured as in the inner layers of the printed circuit board.

The resistance values of the cured or "fired" resistors can range from 40 milliohms per square to 1 megaohm per square depending upon the electronic design requirements. Factors which also may affect the final value of the resistors include print thickness and degree of cure. Resistors having resistance values which differ from each other within a limited range may be printed with one screening operation on a common layer, by using PTF of the same sheet resistivity and by varying the aspect ratio, i.e., the length and width dimensions, of each resistor printed on the layer. Resistors outside of one decade range may still be printed on a common layer by using additional printing and firing operations culminating with laser trimming.

Figure 3:
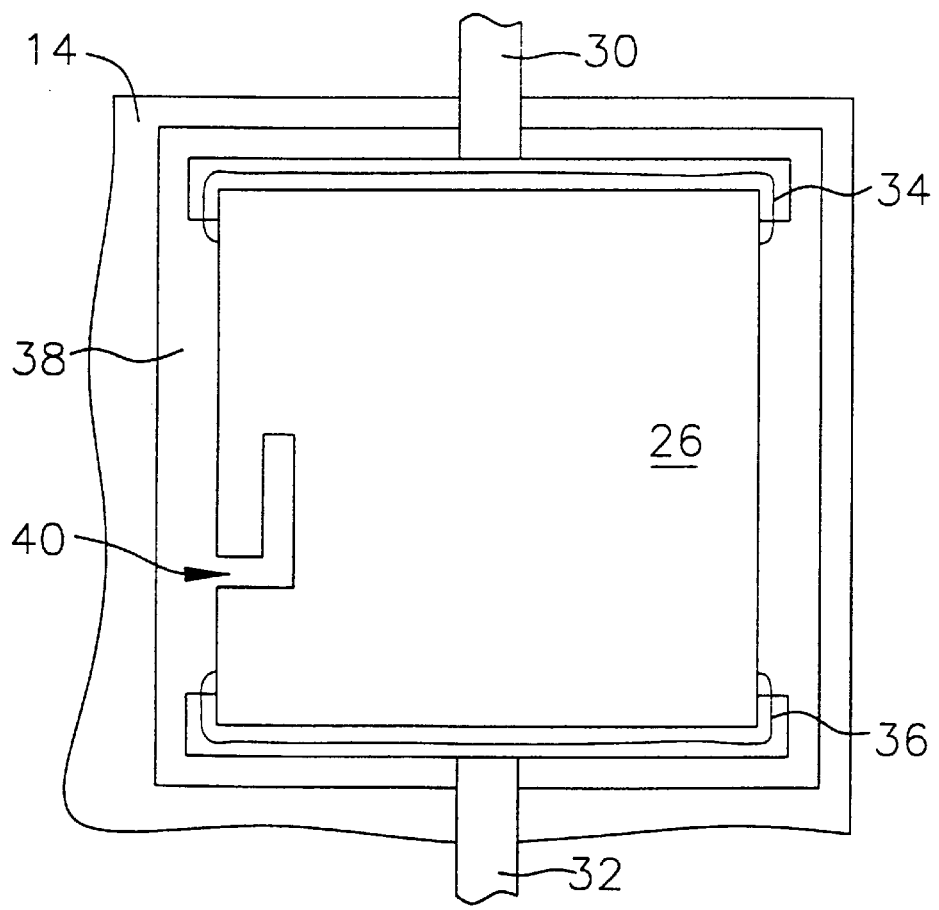
FIG. 3 is an enlarged top plan view of a portion of the layer of FIG. 2.

As noted in FIG. 3 the PTF is screened between conductors, for example, conductors 30 and 32. Conductors 30 and 32 may be copper circuit paths or any other electrical conductor which may be used in conjunction with a printed circuit board. When copper conductors are used, especially when the conductors are approximately 1.4 mils or more thick, it has been found to be beneficial to screen print thin layers of silver ink 34 and 36 over each edge of the conductors 30 and 32 prior to screening the PTF onto the surface of each layer. Preferred is nickel strike at the contacts; Ag, Pd Ag or Pt Ag alternative. The silver ink decreases the contact resistance between the conductors 30, 32 and the resistor and reduces the effect of oxidation of the underlying copper. The silver ink also eliminates the tendency of the resistor to crack at the junction between the resistive paste and the thick copper termination. Cracking at this junction will create partial and/or complete open circuits of the resistors, which will cause them to be unusable. In some instances, especially when the completed printed circuit board may be subject to high ambient humidity, it may prove advantageous to coat each resistor with a dielectric material 38 after the resistors 26 have been screened and cured.

FIG. 3 also shows how each resistor 26 may be trimmed using a laser trimming process in a manner well known in the art to create a void 40 in the resistor which will increase the resistance of the resistor. Preferably, the resistance of each resistor is monitored during the trimming process and the laser trimming operation is controlled using a feedback loop which monitors the resistance as the laser removes material from the body of the resistor.

The printed circuit board 10 of the present invention can also include additional discrete components such as capacitors 42 on each individual layer 12–16. The capacitor comprises metal plates 44 and 46 attached to the upper surface of a bottom layer of the circuit board and the bottom surface of an upper layer of the printed circuit board respectively. In other words the metal plates 44 and 46 are formed on the bottom of one layer and on the top of the adjoining layer which is consistent with the manufacture of standard "double-sided" printed circuit boards. Plates 44 and 46 are formed during the process of making the metal conductor lines on the printed circuit board wherein the metal conductor line is widened to form the capacitor plates as seen best in FIG. 2. Metal plates 44 and 46 are shaped so that the area is determined by the amount of capacitance desired and the dielectric constant of the dielectric of the capacitor wherein this relationship is well known in the art. The dielectric 48 is located between the capacitor plates 44 and 46. A layer of polymer dielectric ink is screen printed onto the printed circuit board such that the capacitor ink covers the capacitor plates formed by the widened conductor lines. The layer of the printed circuit board with the polymer dielectric ink is then heated to approximately 230° C. for such time as the ink is cured. The time and temperature of the curing cycle will vary slightly depending upon the type and thickness of the polymer dielectric ink. The specific type and thickness of the ink is determined upon the performance characteristics of the printed circuit board. Any commercially available dielectric ink is suitable as the dielectric.

If the tolerance of the capacitor needs to be adjusted, then laser trimming of the dielectric is performed. This printing process is then repeated for each layer of the printed circuit board that requires a capacitor with the exception of the top level of the board. The layers are then treated with standard bonding agents known in the industry, assembled into a stack, and bonded using standard techniques such as an autoclave. If a particular layer of the printed circuit board also requires resistors then the preferred method of manufacturing is to screen print and cure the dielectric layer first, then screen print and cure the resistors. After the resistors are cured the layer is coated with the bonding agent, stacked and bonded as described above. If there are resistors on the top surface of the printed circuit board they would be screened and cured as previously described.

The printed circuit board 10 can also contain planar inductors 50 as an integrated passive component. Inductor 50 includes an inductive element 52 shaped in the required form on the bottom side of an upper layer as a part of the metallic conductor lines, similar to plates 44 and 46 for the capacitor, by widening the metal conductor lines. Alternatively the conductive elements of the inductor can be formed on the top side of a layer and the magnetic PTF material screen printed over it. The inductor also includes a magnetic or ferrite layer 54 on the top side of an adjacent bottom layer. In other words, for example inductive element 52 would be located on the bottom of PCB layer 14 and magnetic or ferrite layer 54 would be on the top surface of PCB layer 16. The magnetic or ferrite layer 54 is a magnetic or ferrite polymer ink screened on the top surface of a PCB layer in the area aligned with the planar inductor pattern on the bottom side of the adjacent top layer.

Any commercially available magnetic or ferrite polymer ink is suitable as the magnetic or ferrite layer. After the magnetic of ferrite layer is screened onto the printed circuit board layer the layer is heated to approximately 230° C. for such time as the ink is cured. The time and temperature of the curing cycle will vary slightly depending upon the type and thickness of the ink. The method for manufacturing a printed circuit board layer having resistors, capacitors and inductors would provide for the top side of the layer to be processed with the capacitors screened and cured, then the resistors screened and cured, then the magnetic polymer inks screened and cured. Although the order of screening and curing is not absolutely critical, it is preferred that the magnetic material be screened and cured last so as to minimize undesirable growth of magnetic domains in the magnetic polymer inks.

FIG. 1 illustrates how multiple layers 12, 14 and 16 of the multi-layer printed circuit board may be joined using intermediate layers 18 and 20 of B-stage thermal setting resin between each layer. After bonding the layers together, one or more holes 56 may be drilled through one or more of the layers to make electrical contact between various of the circuits 22 and the passive components or other components 58 and 60 mounted on the top surface 28 of the printed circuit board.

The printed circuit board and the method for its manufacture of this invention results in the formation of passive components that are buried in the PCB with the required electrical properties at processing temperatures that do not impact the mechanical or electrical properties of the PCB and remain flexible to withstand the pressures and flexing of the PCB during fabrication of the PCB itself, the insertion or mounting of other electrical parts or mounting in an electronics assembly. This invention further provides the advantage of not requiring equipment beyond the normal operations of a printed circuit board fabricator, nor does it require changes to the standard printed circuit board materials. The polymer ink based components will flex and retain their shape under severe, repeated flexures and since they are cured at the temperatures associated with the autoclave bonding process and the soldering temperatures normally associated with the assembly of other electronic components on the PCB. These components have the additional benefit of curing well below the glass transition temperature of the rigid boards, and well within the processing range of the polymer tapes utilized in flexible circuit boards. The mechanical strength and flexure characteristics make the passive components an ideal match for use with flexible printed circuit boards.

Although the present invention has been disclosed and illustrated with respect to a preferred embodiment thereof, it is to be understood that the invention is not to be so limited and that other changes and modifications can be made within the full intended scope of the invention as hereinafter claimed.

What is claimed is:

1. A multi-layer printed circuit board having a plurality of buried passive elements comprising:

a plurality of circuit board layers bonded together;

at least one electrical circuit on each layer;

a polymer ink resistor screened on at least one of the layers in electrical contact with the electrical circuit;

a capacitor having an upper capacitor plate and a lower capacitor plate formed in the electrical circuits of adjacent circuit board layers and a polymeric ink dielectric screened between the upper and lower capacitor plates; and an inductor element formed in the electrical circuit of a circuit board layer and a polymeric ink layer screened on an adjacent circuit board layer in line with the inductor element.

2. The printed circuit board of claim 1 further having a bonding agent between adjacent printed circuit board layers.

3. The printed circuit board of claim 1 wherein the circuit board layers have an electrical circuit on an upper surface and on a lower surface.

4. The printed circuit board of claim 1 wherein the capacitor plates are integral with the electrical circuit.

5. The printed circuit board of claim 1 wherein the polymeric ink layer is magnetic.

6. The printed circuit board of claim 1 wherein the polymeric ink layer is ferrite.

7. A multi-layer printed circuit board comprising:

a plurality of circuit board layers bonded together;

an electrical circuit on an upper surface and a lower surface of each printed circuit board layer;

a first buried passive element screened in electrical contact with the electrical circuits between adjacent circuit board layers; and a second and different buried passive element screened in electrical contact with the electrical circuits between adjacent circuit board layers, wherein the second passive element is an inductor having an inductor element formed in the electrical circuit of a circuit board layer and a polymeric ink layer screened on an adjacent circuit board layer in line with the inductor element.

8. The printed circuit board of claim 7 wherein the first passive element is a resistor.

9. The printed circuit board of claim 7 wherein the first passive element is a capacitor having an upper capacitor plate and a lower capacitor plate formed in the electrical circuits of adjacent circuit board layers and a polymeric ink dielectric screened between the upper and lower capacitor plates.

10. The printed circuit board of claim 9 further comprising a third buried passive element positioned between adjacent printed circuit board layers.

11. The printed circuit board of claim 10 wherein the third passive element comprises a resistor.

12. A method for producing a printed circuit board having a plurality of circuit board layers comprising:

generating electrical circuits on each individual circuit board layer, the electrical circuits having portions to accommodate passive components;

depositing a first polymer ink on the electrical circuits to form at least one first passive component;

curing the first polymer ink;

depositing a second and different polymer ink on the electrical circuits to form at least one second passive component, wherein the second passive component is an inductor having an inductor element formed in the electrical circuit of one of the circuit board layers and wherein the polymer ink is screened on an adjacent circuit board layer in line with the inductor element;

curing the second polymer ink; and bonding the circuit board layers together to form a multi-layer printed circuit board.

13. The method of claim 12 wherein the first polymer ink is a polymer dielectric ink and the first passive component is a capacitor.

14. The method of claim 12 wherein the first polymer ink is a polymer resistor ink and the first passive component is a resistor.

* * * * *